United States Patent [19]

Gruodis

[11] Patent Number: 5,285,453
[45] Date of Patent: Feb. 8, 1994

[54] TEST PATTERN GENERATOR FOR TESTING EMBEDDED ARRAYS

[75] Inventor: Algirdas J. Gruodis, Wappingers Falls, N.Y.

[73] Assignee: International Business Machines Corporation, Armonk, N.Y.

[21] Appl. No.: 636,035

[22] Filed: Dec. 28, 1990

[51] Int. Cl.$^5$ ............................................. G01R 31/28
[52] U.S. Cl. ...................................... 371/27; 371/22.3
[58] Field of Search ......................... 371/27, 21.1, 21.3, 371/22.1, 22.3, 15.1

[56] References Cited

U.S. PATENT DOCUMENTS

| | | | |
|---|---|---|---|
| 3,781,829 | 12/1973 | Singh | 371/27 |
| 3,783,254 | 1/1974 | Eichelberger | 235/152 |
| 4,402,081 | 8/1983 | Ichimiya et al. | 371/27 |
| 4,639,919 | 1/1987 | Chang et al. | 371/27 |
| 4,670,879 | 6/1987 | Okino | 371/27 |
| 4,807,229 | 2/1989 | Tada | 371/27 |
| 4,862,460 | 8/1989 | Yamaguchi | 371/27 |
| 4,928,278 | 5/1990 | Otsuji et al. | 371/27 X |
| 4,931,723 | 6/1990 | Jeffrey et al. | 371/22.3 |
| 4,989,209 | 1/1991 | Littlebury et al. | 371/22.1 |
| 5,127,011 | 6/1992 | Combs et al. | 371/27 |

OTHER PUBLICATIONS

"Array Test Pattern Generation Algorithms for a Per Pin Tester" IBM Technical Disclosure Bulletin, vol. 30, No. 10 pp. 116–123.
"Algorithmic Random Pattern Generation Using Deterministic Seeds" IBM Technical Disclosure Bulletin, vol. 31, No. 11 pp. 160–161, (Apr. 1989).
"Algorithmic Pattern Generation At the Tester" IBM Technical Disclosure Bulletin, vol. 32, No. 6A, pp. 76–79 (Nov. 1989).
"Modified Logic Test Hardware Enhancement" IBM Technical Disclosure Bulletin, vol. 32, No. 11, pp. 248–249 (Apr. 1990).

*Primary Examiner*—Stephen M. Baker
*Assistant Examiner*—Ly V. Hua
*Attorney, Agent, or Firm*—Donald M. Boles; Harold Huberfeld

[57] ABSTRACT

An Algorithmic Test Pattern Generator (APG) of sufficient simplicity to be replicated at every pin of a tester. This APG is comprised of two counters and various controls capable of manipulating the counters and generating output data which is based on command and counter status. The circuit is capable of testing VLSI logic and analog circuitry, and is specifically well suited to test embedded arrays that can only be accessed through LSSD shift register chains.

7 Claims, 3 Drawing Sheets

TEST PATTERN GENERATOR FOR TESTING EMBEDDED ARRAYS

FIELD OF THE INVENTION

This invention relates, generally, to a tester apparatus and more particularly to a tester apparatus having a self-contained algorithmic test pattern generator replicated on every pin and capable of efficiently testing embedded arrays.

BACKGROUND OF THE INVENTION

Testing VLSI products and specifically chips, modules, cards, and boards, is becoming more and more difficult in view of the ever increasing circuit speed, density and complexity of the logic. In the past, testing logic and arrays (also known as memory) was routinely performed on different testers; a first pass on a logic tester followed by a second pass on an array or (memory) tester. Two pass testing, though, is never ideal because it is expensive, cumbersome and time consuming. The advent of arrays embedded in logic brought an additional degree of complexity to testing, mainly because as embedded arrays become commonplace, logic designers were reluctant to take the necessary effort of segregating the logic from the array by assigning independent I/O's to each portion and incorporating in their designs a way of isolating the logic from the array.

Testing arrays differs radically from testing logic. Arrays, being highly structured, require highly regular test vectors. Logic, on the other hand, is more random in nature, and is usually tested by means of heuristic patterns, either deterministic in nature, pseudo-random or even fully random. To ensure adequate testability and fault coverage, certain design constraints, known as 'design for testability' were introduced and subsequently extensively used. A good example of a typical design for testability is a scan design and, more particularly, a Level-Sensitive-Scan-Design (LSSD) well known to those familiar with the art, and fully described in U.S. Pat. No. 3,783,254 to E. K. Eichelberger. By constraining a designer to certain design rules, full testability of the product can be guaranteed.

In an LSSD design, data may be entered serially through a scan chain comprised of shift-registers and propagated through combinatorial logic to either another chain of shift registers or to the primary outputs. To facilitate testing embedded arrays, scan chains are used to isolate logic from the array.

It is known to those familiar with the art that embedded arrays necessitate highly regular and structured patterns. These patterns cannot be easily applied to the array inputs through the logic portion of the product unless means for controlling signals at the inputs of the embedded array is enforced through the use of special circuitry such as the above described LSSD shift-register chains.

Typical array testers contain a memory element capable of storing large volumes of test vectors to be applied to the array under test. This is particularly important since arrays may routinely require test vector sequences in the order of $N^2$, where N is the memory size. Furthermore, since only one test vector can be read out of memory at each step, an array tester is inherently slow, e.g., 100 to 300 Mhz maximum, thus resulting in excessively long testing times.

Testers also commonly include address generating circuitry that provides a sequence of addresses to the memory. Each pin of the tester is additionally provided with electronic circuitry that includes one driver and one receiver per pin, and a plurality of multiplexers to multiplex addresses, data and controls.

Later generation testers have been modified to increase speed, flexibility and versatility. The most noted innovation has been making a tester truly 'per-pin' whereby the electronics associated with each pin is self-contained, with all the elements present that provide a complete test to any I/O of the DUT (Device-Under-Test). Thus, each pin may be driven by electronic circuitry having its own pin memory circuit for storing instructions, control circuitry for decoding instructions and for generating next instruction addresses for the pin memory. These and other features are fully described in U.S. Pat. No. 4,931,723 to A. K. Jeffrey, et al.

An important characteristic of a 'per-pin' tester design is its unique processing element, commonly referred to as a channel, which is connected to each input or bi-directional driver of the DUT. All the channels in such an architecture run concurrently in a pipelined configuration. Data, addresses, commands, and control signals for the DUT are loaded into the memory associated with each channel prior to running a test. Storing addresses into the channel's memory allows generating any sequence of addresses for a given test. However, this exhausts whatever available memory exists in the channel because of excessive volume.

The need to move large volumes of test data in and out of memory imposes serious limitations to the design of a tester apparatus as well as highly restrictive constraints to its speed. Creating test vectors algorithmically at the tester would clearly obviate the need for such large memories and correspondingly would improve the tester's performance. This would allow the application of data, commands and control sequences to many addresses in the Device-Under-Test (DUT) while keeping only one copy of the sequences stored in the channel. Typically, the algorithmic address generator, usually in the form of a counter, is repeated on each channel. Examples of various algorithmic test generators are found in U.S. Pat. No. 4,807,229 to Tetsuo Tada and in the IBM Technical Disclosure Bulletins, Vol. 31, No. 11 of April 1989, "Algorithmic Random Pattern Generator using Deterministic Seeds", pp. 160-161; in Vol. 32, No. 11, of April 1990, pp. 248-249, "Modified Logic Test Hardware Enhancement"; in Vol. 32, No. 6A, pp. 76-79, "Algorithmic Pattern Generation at the Tester", and in Vol. 30, No. 10, of March 1988, pp. 116-123, "Array Test Pattern Generation Algorithms for a Per-Pin Tester". The above references commonly provide means for generating test patterns in software by taking a canonical or high-level representation of an array test pattern (e.g, walking or marching 0's and 1's, ripple word or bit, checkerboard, in which 0's and 1's alternate in a regular pattern, etc.) and exploding these patterns into a binary sequence of 0's and 1's. Of particular interest are those called 'disturb test', whereby a Home cell address is selected and every other (i.e., Away) cell location for each Home address is polled to determine whether or not it was disturbed.

In view of the aforementioned limitations presently found in the art, it is an object of the present invention to algorithmically generate test patterns in the tester hardware to test embedded arrays.

It is a further object of the present invention to build an algorithmic test pattern generator, sufficiently simple to be replicated at each pin of a 'per-pin' tester.

It is yet another object of the invention to avoid the need of shifting long test sequences into a single LSSD shift register that isolates an array from logic by assigning an LSSD Array Pattern Generator (APG) generator to each tester pin, thus allowing the Device-Under-Test (DUT) to have several short registers.

It is a more particular object of the invention to use incrementing/decrementing counters to algorithmically create an array test pattern.

It is still a more particular object of the invention to select bits in one counter at which incrementing and decrementing will start and end.

It is yet a further object of the invention to transfer the contents of one counter to a second counter, while choosing which bits of the second counter will control the operation of the first counter, thus producing a compact and powerful APG (Array Pattern Generator).

These and other objects are achieved by the use of this present invention which produces a test pattern generator for testing embedded arrays in an integrated circuit, comprising: an integrated circuit having an embedded array thereon; LSSD circuitry for inputting and outputting test data, respectively, to and from the embedded array; and command-driven generators for creating binary test patterns for the embedded arrays.

BRIEF DESCRIPTION OF THE DRAWINGS

The invention will be more clearly understood from the following description in conjunction with the accompanying drawings, wherein.

PREFERRED EMBODIMENT OF THE INVENTION

Advanced test system capable of testing logic, arrays, and embedded arrays are commonly architected in a 'per-pin' configuration. Central to this 'per-pin' architecture is a Data Vector Processor (DVP) which is designed to act as a pin controller capable of incorporating both logic and array test functions.

The speed of a tester is directly linked to the speed with which the Program Controller can disseminate information to the Test Pattern Generator (TPG) associated with each pin. This is the underlying reason for using a data vector processor (DVP) which not only alleviates this condition but also makes each pin truly stand alone.

The test pattern generators incorporated in the test system in accordance with the present invention are designed to have the data vector processor also provide algorithmic loop structures to reduce test program size and facilitate pin programmability. This provides a unique 'per-pin' means of generating test data to arrays which are accessible only via an LSSD scan chain.

Each DVP is designed to have an LSSD algorithmic test pattern generator (APG) which is implemented to test embedded arrays through Boundary Scan rings and LSSD shift register strings. This allows testing arrays which are only accessible via the DUT's input Shift Register Latch chain (SRL). The commands that control the LSSD APG logic are incorporated in the data stream and stored in memory.

Testing embedded arrays commonly requires large amounts of data, specially when the array is only accessible via the DUT's SRL chain. In order to alleviate the need for transmitting large volumes of data, the LSSD APG is, preferably, incorporated in the design of the DVP. Its unique characteristic is the working of its two counters, preferably 24 bits long, which allow addressing up to 16 Mb arrays. Characteristically, the inventive LSSD APG allows for the generation of array patterns of up to a maximum pattern generation rate of at least 250 Mhz.

It is known to those skilled in the art that this type of testing can generate large volumes of data. Therefore it is preferable to handle test data in algorithmic or high-level form to be referred, henceforth, as canonical or command-driven form, allowing its conversion into binary data only when required by the tester. The commands required to operate the LSSD APG are stored in the memory associated with the DVP. These commands tell the two counters, henceforth referred to as counter 'H' and counter 'A', for Home and Away, respectively, how to perform prior to the next structure, (defined as data stored in the SRL chain). Structure data usually follows the list of subcommands, with the length of the structure data equal to the number of SRL's in the chain under test.

HARDWARE DESCRIPTION OF THE LSSD APG

Figure 1:
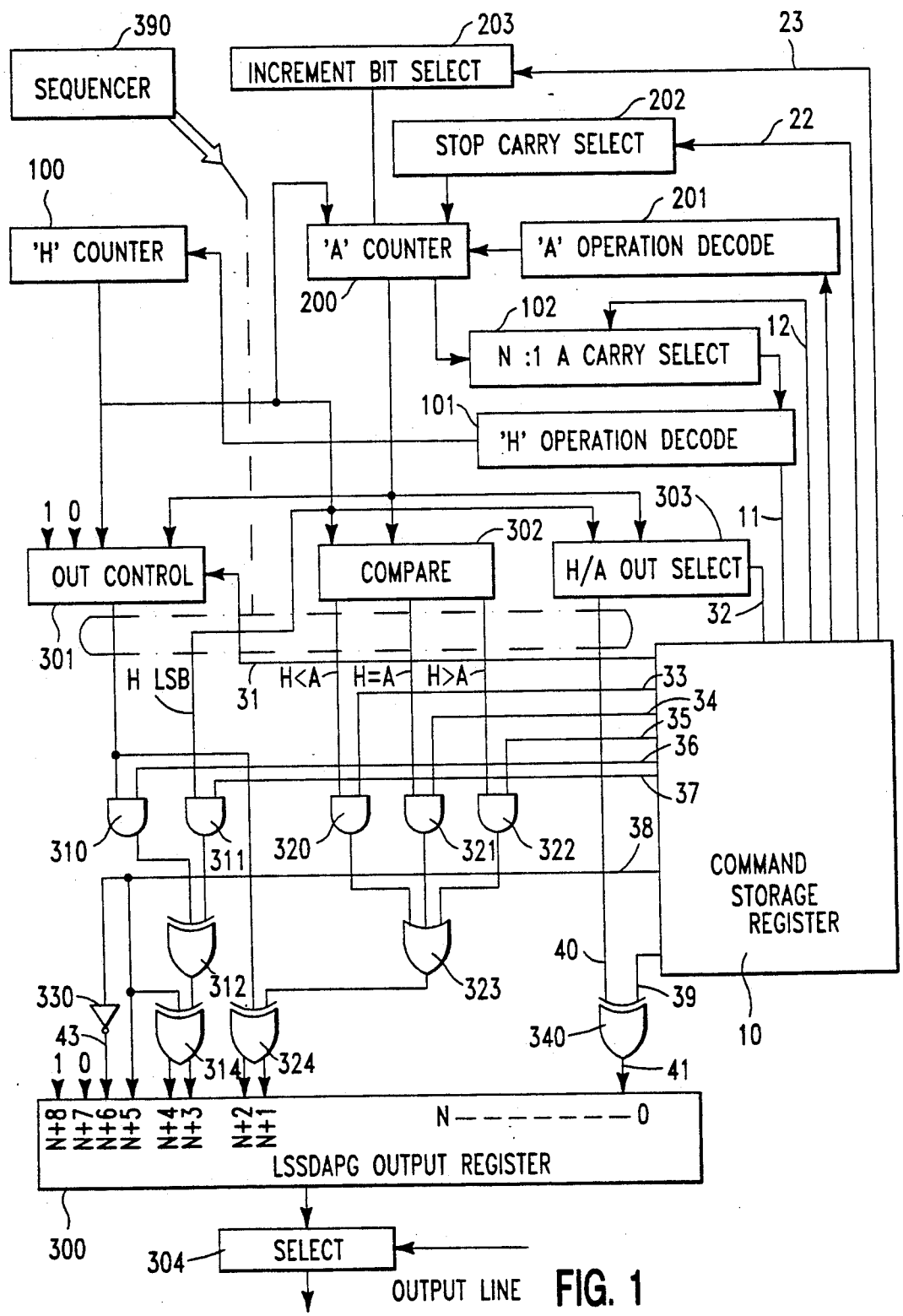
FIG. 1 is a block diagram of the 'per-pin' LSSD APG generator of the present invention.

Referring now to FIG. 1, an LSSD APG consisting of five main sections is shown hereinafter:

1. Block 10—the command storage register.
2. Blocks 100-102—"Home" counter and associated control logic.
3. Blocks 200-203—"Away" counter and associated control logic.
4. Blocks 300-340—Output select section.
5. Block 390—Timing and sequencing section for all of the above.

The command storage register 10 accepts a command word from a controlling section and stores it for use for processing the next pattern generated by the LSSD APG. This register will hold the command word until the sequencer goes through a complete cycle to update output register 300. The command word is divided into a plurality of distinct subcommands, each of which has a specific code that controls its associated logic block to be described later.

Block 100 is an N bit counter designed to address the "Home" location of the memory array under test (MUT). This counter, which is controlled by the command stored in the command register 10, may:

a. Reset to all 0's; or
b. Increment by a count of 1; or
c. Decrement by a count of 1; or
d. Pause—skip a command cycle.

The above four functions are controlled by bus 11. In addition to the data on bus 11, the absence of a carry bit at a preselected position of the 'Away' counter 200 can inhibit the increment and decrement operations. The selection of the carry bit is performed in block 102 which, additionally, decodes information on bus 12.

The "Away" or 'A' counter 200, which is normally used to address the MUT cell exercised to produce a disturb condition in the "Home" cell, is typically more complicated then the "Home" or 'H' counter 100. The 'A' counter, also comprised of N bits, performs the following basic operations:

a. Reset to 0; or
b. Increment by a count of $2^n$, where $n \leq N$; or
c. Decrement by a count of $2^n$; or
d. Load with data from 'H' counter.

These operations are controlled by the 'A' operation decoder 201 which decodes the information on bus 21. The increment and decrement operations are further modified by a stop carry select and increment bit select (202 and 203). The increment bit select 203 decodes the subcommand on bus 23 and forces the 'A' counter to be incremented or decremented, starting at any bit. This in effect allows the counter to count in increments of $2^n$. The stop-carry-select 202 decodes the subcommand on bus 22 and stops the 'A' carry/borrow bit from propagating, thus allowing the higher order bits to remain undisturbed.

The output section, consisting of blocks 300 to 340, is used to determine the address, data-in, expected data-out, and array controls of the module-under-test. The last timing signal in the sequence from block 390 latches the output into register 300. A portion of output register 300 stores the contents of 'H' or 'A' either directly or after inversion of all the counter bits. This inversion is controlled by line 39.

The output section, additionally, generates four types of outputs that are used as data and control line signals for the MUT. A true and complement for each type are available. The four types include:

1. Fixed output level (41,42) generally used as a bias for those LSSD stages not directly involved in driving the MUT.
2. Direct output of one bit of the command (38) normally used to control R/W, output enable, etc., on the MUT.
3. Data controlled by some selected bits of 'H' and 'A' counters.

Selection is done by means of the out control 301 which interprets subcommands on bus 31. The type of control is determined by AND gates 310, 311, and by Exclusive-OR gates 312, and 314 which are activated, respectively, by lines 36, 37, and 38.

Figure 2:
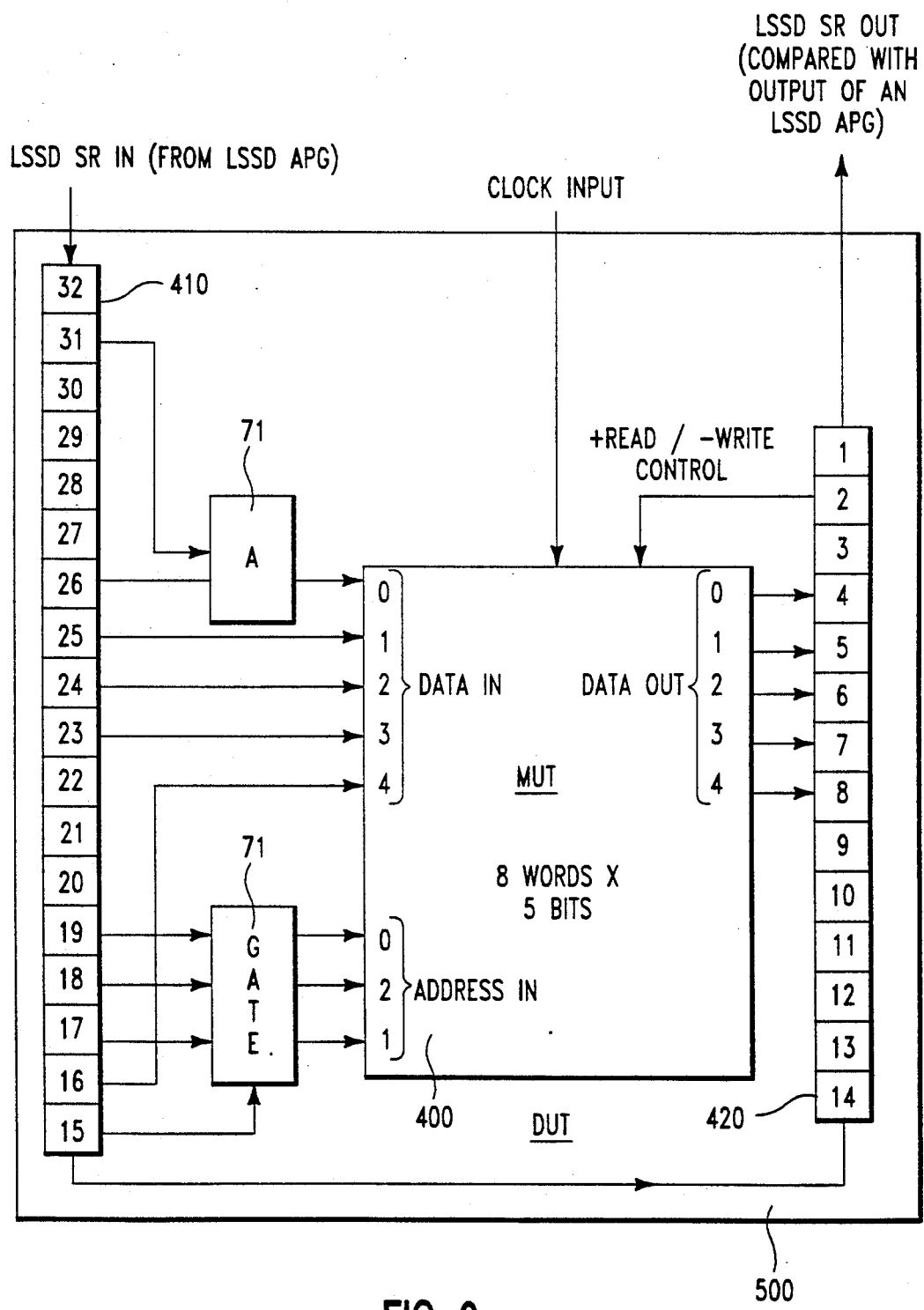
FIG 2 is a schematic diagram of a DUT surrounded by two LSSD SRL's (Shift Register Latches) in accordance with the present invention.

4. Output data controlled by comparing the contents of counters 'A' and 'H'. The comparison is done in block 302, which produces three outputs:
a. H>A
b. H=A
c. H<A Control lines 33, 34, and 35 are used to drive AND gates 320, 321, and 322, respectively, that select which of the above conditions are to be activated. These conditions are then OR'ed (323) and transferred to Exclusive-OR gate 324. Gate 324 is then used as a conditional inversion of the selected output 42. Once the output data is latched in register 300, selector 304 is used to sequence the desired outputs from the LSSD APG into a string of serial data. This data is then fed into the LSSD shift register string of the DUT 500 that contains the MUT 400, as shown in FIG. 2.

The data that drives the selector is created in a pattern memory or generator that is external to the LSSD APG. As soon as the selection process is initiated, a new command can be stored in register 10 and the timing sequencer restarted for the execution of this new command. This is done simultaneously, i.e., the scan of output data, occurring at the same time as the execution of the next command. The process of latching the results into register 300 is held up until the scan is completed. For this reason, the LSSD APG does not need to be excessively fast, thus keeping its cost down and allowing the use of low cost technology. High scan speed can be achieved by parallel selection of data during several cycles and by then placing it into a high speed shift register for speed purposes.

The operation of the LSSD APG follows the sequence listed below:

1. Initialize the LSSD APG with a command to reset the 'A' and 'H' counters.
2. Wait for the output to be latched in register 300.
3. Store a new command in register 10.
4. Activate select 304 with a stored or generated pattern that represents the relationship between the MUT 400 inputs and their connection to the LSSD shift register string 410, as shown in FIG. 2.
5. Latch the results of the previous command in register 300 and store a new command in register 10.
6. Repeat steps 4 and 5 until completion of the test.

A better understanding of how patterns are generated may be gained by showing various examples.

Referring to FIG. 2, a simple embedded array is considered. Two LSSD APGs will be involved in this test—one to drive the LSSD SR input 410, the other to generate data to be compared with the results of the data scanned out from the output LSSD SR 420.

Also shown are gates 71 which account for the case when combinatorial logic exists in between the shift register SR chain 410 and the MUT 400. In this instance, some of the inputs to test the logic need to be set at a specific level for the proper signals to be applied to the inputs of the MUT 400.

Assuming M (number of words) to be $2^3 = 8$ (three address lines):

Test #1—write 1's into bits 0,2,4 at all locations starting with address 0 and end with M1.

Test #2—read the above stored data starting with address 0 and up to M1.

Test #3—repeat test #1 with complemented data.

Test #4—read the above data.

Note that in the example of FIG. 2, proper operation requires that shift register position 31 (SR31) be set at 1, and SR15 at 0.

All other stages (shown unconnected) are assumed to have no influence on the MUT test and, consequently, are forced to 0.

The commands for both LSSD APGs (SR-In and SR-Out) are identical:

1. Initialize—reset 'H' and 'A'. Store the contents of counter 'A' in output register 300 (bits 0–N). Set output control bus 31 to select 'A' bit 3 (A3), control bus 22 to stop carry at A3, control bus 23 to increment 'A' at A0, control bus 12 to increment 'H' if A4 carry=1, and finally, set output control lines 33–36, 38, 39 to 0 and output control line 37 to 1. These output selections will make:

Output N+1=A3
Output N+2 = —A3
Output N+3=H0
Output N+4= —H0
Output N+5=0
Output N+6=1
Output N+7=0

Output N+8=1

2. Increment 'A' and 'H', if A3=1. Keep all other control bits the same as in the initial command.

3. Repeat step 2 eight times.

This is because the output data during the write time could be undefined.

The data in the used bits of the output register will look as follows:

| N+8 | N+7 | N+4 | N+3 | N+2 | 2 | 1 | 0 | | Command executed |
|---|---|---|---|---|---|---|---|---|---|
| 1 | 0 | −H0 | H0 | −A3 | A2 | A1 | A0 | | |
| 1 | 0 | 1 | 0 | 1 | 0 | 0 | 0 | 1 | Initialization |
| 1 | 0 | 1 | 0 | 1 | 0 | 0 | 1 | 2 | Increment |
| 1 | 0 | 1 | 0 | 1 | 0 | 1 | 0 | 3 | " |
| 1 | 0 | 1 | 0 | 1 | 0 | 1 | 1 | 4 | " |
| 1 | 0 | 1 | 0 | 1 | 1 | 0 | 0 | 5 | " |
| 1 | 0 | 1 | 0 | 1 | 1 | 0 | 1 | 6 | " |
| 1 | 0 | 1 | 0 | 1 | 1 | 1 | 0 | 7 | " |
| 1 | 0 | 1 | 0 | 1 | 1 | 1 | 1 | 8 | " |
| 1 | 0 | 1 | 0 | 0 | 0 | 0 | 0 | 9 | " |
| 1 | 0 | 1 | 0 | 0 | 0 | 0 | 1 | 10 | " |
| 1 | 0 | 1 | 0 | 0 | 0 | 1 | 0 | 11 | " |
| 1 | 0 | 1 | 0 | 0 | 0 | 1 | 1 | 12 | " |
| 1 | 0 | 1 | 0 | 0 | 1 | 0 | 0 | 13 | " |
| 1 | 0 | 1 | 0 | 0 | 1 | 0 | 1 | 14 | " |
| 1 | 0 | 1 | 0 | 0 | 1 | 1 | 0 | 15 | " |
| 1 | 0 | 1 | 0 | 0 | 1 | 1 | 1 | 16 | " |
| 1 | 0 | 0 | 1 | 1 | 0 | 0 | 0 | 17 | " |
| 1 | 0 | 0 | 1 | 1 | 0 | 0 | 1 | 18 | " |
| 1 | 0 | 0 | 1 | 1 | 0 | 1 | 0 | 19 | " |
| 1 | 0 | 0 | 1 | 1 | 0 | 1 | 1 | 20 | " |
| 1 | 0 | 0 | 1 | 1 | 1 | 0 | 0 | 21 | " |
| 1 | 0 | 0 | 1 | 1 | 1 | 0 | 1 | 22 | " |
| 1 | 0 | 0 | 1 | 1 | 1 | 1 | 0 | 23 | " |
| 1 | 0 | 0 | 1 | 1 | 1 | 1 | 1 | 24 | " |
| 1 | 0 | 0 | 1 | 0 | 0 | 0 | 0 | 25 | " |
| 1 | 0 | 0 | 1 | 0 | 0 | 0 | 1 | 26 | " |
| 1 | 0 | 0 | 1 | 0 | 0 | 1 | 0 | 27 | " |
| 1 | 0 | 0 | 1 | 0 | 0 | 1 | 1 | 28 | " |
| 1 | 0 | 0 | 1 | 0 | 1 | 0 | 0 | 29 | " |
| 1 | 0 | 0 | 1 | 0 | 1 | 0 | 1 | 30 | " |
| 1 | 0 | 0 | 1 | 0 | 1 | 1 | 0 | 31 | " |
| 1 | 0 | 0 | 1 | 0 | 1 | 1 | 1 | 32 | " |
| 1 | 0 | 1 | 0 | 1 | 0 | 0 | 0 | 33 | " |

4. Repeat steps 2 and 3 four times.

The following is the order in which the outputs have to be selected to produce the proper application of patterns to the MUT 400.

| Shift Register position | Description | Output Register 300 bit number |
|---|---|---|
| 1, 3, 9-14, 20-22, 27-30, 32 | Don't care | N + 7 |
| 2 | +write/−read | N + 2 |
| 4 | +data 0 out | N + 4 |
| 5 | +data 1 out | N + 3 |
| 6 | +data 2 out | N + 4 |
| 7 | +data 3 out | N + 3 |
| 8 | +data 4 out | N + 4 |
| 15 | −enable | N + 7 |
| 16 | +data 4 in | N + 4 |
| 17 | +address 1 | 1 |
| 18 | +address 2 | 2 |
| 19 | +address 0 | 0 |
| 23 | +data 3 in | N + 3 |
| 24 | +data 2 in | N + 4 |
| 25 | +data 1 in | N + 3 |
| 26 | +data 0 in | N + 4 |
| 31 | +enable | N + 8 |

The above scan pattern is applied to both LSSD APG's (4×8=) 32 times. Particular note should be made that the receiving pin error log is turned off while scanning the output data during the write operation.

It is worth noting that the scan is delayed by one command, thus, the results of the last command will not be scanned. It is evident from the previous example that the use of two commands allows running four test sections.

Another example may require a checkerboard pattern in each bit plane and alternating bit planes having complemented data.

Bit planes 0,2,4

| 0 | 0 | 1 | 1 |
|---|---|---|---|
| 2 | 1 | 3 | 0 |
| 4 | 0 | 5 | 1 |
| 6 | 1 | 7 | 0 |

Bit planes 1,3

| 0 | 1 | 1 | 0 |
|---|---|---|---|
| 2 | 0 | 3 | 1 |
| 4 | 1 | 5 | 0 |
| 6 | 0 | 7 | 1 |

Since the physical layout was not altered, the scan sequence remains unchanged. However, the +write/−read line is now on A3.

The following changes are required to make the commands modify the input and expected output data:

1. The output section select commands are:
   a) the output selected by 301 based on command 31 is now A0, and lines 36 and 37 a 1.
   b) select line 38 is held at 1 for the first two tests and 0 for the last two, for inversion of the data.
   c) counter 'H' is incremented whenever A0 bit has a carry.

| N+8 | N+7 | N+4 | N+3 | 3 | 2 | 1 | 0 | Command executed |
|---|---|---|---|---|---|---|---|---|

| | | | | | | | | | |
|---|---|---|---|---|---|---|---|---|---|
| 1 | 0 | 0 | 1 | 1 | 0 | 0 | 0 | 1 | Initialization |
| 1 | 0 | 1 | 0 | 1 | 0 | 0 | 1 | 2 | Increment |
| 1 | 0 | 1 | 0 | 1 | 0 | 1 | 0 | 3 | " |
| 1 | 0 | 0 | 1 | 1 | 0 | 1 | 1 | 4 | " |
| 1 | 0 | 0 | 1 | 1 | 1 | 0 | 0 | 5 | " |
| 1 | 0 | 1 | 0 | 1 | 1 | 0 | 1 | 6 | " |
| 1 | 0 | 1 | 0 | 1 | 1 | 1 | 0 | 7 | " |
| 1 | 0 | 0 | 1 | 1 | 1 | 1 | 1 | 8 | " |
| 1 | 0 | 0 | 1 | 0 | 0 | 0 | 0 | 9 | " |
| 1 | 0 | 1 | 0 | 0 | 0 | 0 | 1 | 10 | " |
| 1 | 0 | 1 | 0 | 0 | 0 | 1 | 0 | 11 | " |
| 1 | 0 | 0 | 1 | 0 | 0 | 1 | 1 | 12 | " |
| 1 | 0 | 0 | 1 | 0 | 1 | 0 | 0 | 13 | " |
| 1 | 0 | 1 | 0 | 0 | 1 | 0 | 1 | 14 | " |
| 1 | 0 | 1 | 0 | 0 | 1 | 1 | 0 | 15 | " |
| 1 | 0 | 0 | 1 | 0 | 1 | 1 | 1 | 16 | " |
| 1 | 0 | 1 | 0 | 1 | 0 | 0 | 0 | 17 | " |
| 1 | 0 | 1 | 0 | 1 | 0 | 0 | 1 | 18 | " |
| 1 | 0 | 0 | 1 | 1 | 0 | 1 | 0 | 19 | " |
| 1 | 0 | 0 | 1 | 1 | 0 | 1 | 1 | 20 | " |
| 1 | 0 | 1 | 0 | 1 | 1 | 0 | 0 | 21 | " |
| 1 | 0 | 1 | 0 | 1 | 1 | 0 | 1 | 22 | " |
| 1 | 0 | 0 | 1 | 1 | 1 | 1 | 0 | 23 | " |
| 1 | 0 | 0 | 1 | 1 | 1 | 1 | 1 | 24 | " |
| 1 | 0 | 1 | 0 | 0 | 0 | 0 | 0 | 25 | " |
| 1 | 0 | 1 | 0 | 0 | 0 | 0 | 1 | 26 | " |
| 1 | 0 | 0 | 1 | 0 | 0 | 1 | 0 | 27 | " |
| 1 | 0 | 0 | 1 | 0 | 0 | 1 | 1 | 28 | " |
| 1 | 0 | 1 | 0 | 0 | 1 | 0 | 0 | 29 | " |
| 1 | 0 | 1 | 0 | 0 | 1 | 0 | 1 | 30 | " |
| 1 | 0 | 0 | 1 | 0 | 1 | 1 | 0 | 31 | " |
| 1 | 0 | 0 | 1 | 0 | 1 | 1 | 1 | 32 | " |
| 1 | 0 | 1 | 0 | 1 | 0 | 0 | 0 | 33 | " |

By way of a second example, an array with 16 address locations is arranged in a 4×4 array, namely, as a 1 bit array. In order to test it, the array is loaded with all 0's. These are to be followed by a column disturb test that consists of writing a 1 in the cell under test to be followed by a 1 and 0 in each cell in the same column. Since the scan commands are pattern independent, only LSSD APG commands necessary to produce the test vectors will be discussed hereinafter. The following outputs from register 300 selected are:

| Output | used for |
|---|---|
| 0 | address bit 0 |
| 1 | address bit 1 |
| 2 | address bit 2 |
| 3 | address bit 4 |
| N + 5 | +write/−read control |
| N + 1 | +data in or +data out expect. |

With this setup in place, lines 33-35 are selected to be 0 for all commands. This forces the output of block 323 to remain at 0, while letting gate 324 pass the output from 301 (on line 42) and appear on line N+1. With line 38 at 1 for a write command and 0 for a read command, the control bus 31 selects the output of 301 to be 1 when data is to be 1, and 0 when a 0 is required.

The commands can now be summarized as follows:
a. reset counters—'H' is output—write 0
b. increment 'H'—'H' is output—write 0
c. repeat step b 15 times.
d. reset counter 'H'—'H' is output—write 1
e. load 'H' to 'A'—'H' is output—read 1
f. increment 'A' at bit A2 stop carry at A3—'A' is output—write 1
g. hold counters—'A' is output—write 0
h. repeat steps f and g 3 times.
i. hold counters—'H' is output—read 1
j. hold counters—'H' is output—write 0
k. increment 'H'—'H' is output—write 1
l. go to step e and repeat steps e to k 16 times.

Particular attention is to be given when exercising the column disturb portion of the test. Whenever 'H' is loaded into 'A', 'A' is set to the same column as 'H', the cell under test. By incrementing the A2 bit, the disturb cell is moved in the same column from one row to the next. By keeping the carry bit from propagating past A3, a return to the same column takes place upon reaching the end. For example: if the present 'H' is 6, step e will make 'A' 6, step f will make it 10, 14 and 2. In a similar manner, more complicated address patterns can easily be constructed. Patterns, such as nearest neighbor or row disturb or even some N squared patterns can be constructed. Similarly, the data structure can be changed to all 1's or 0's, checkerboard, column bars or row bars.

Figure 3:
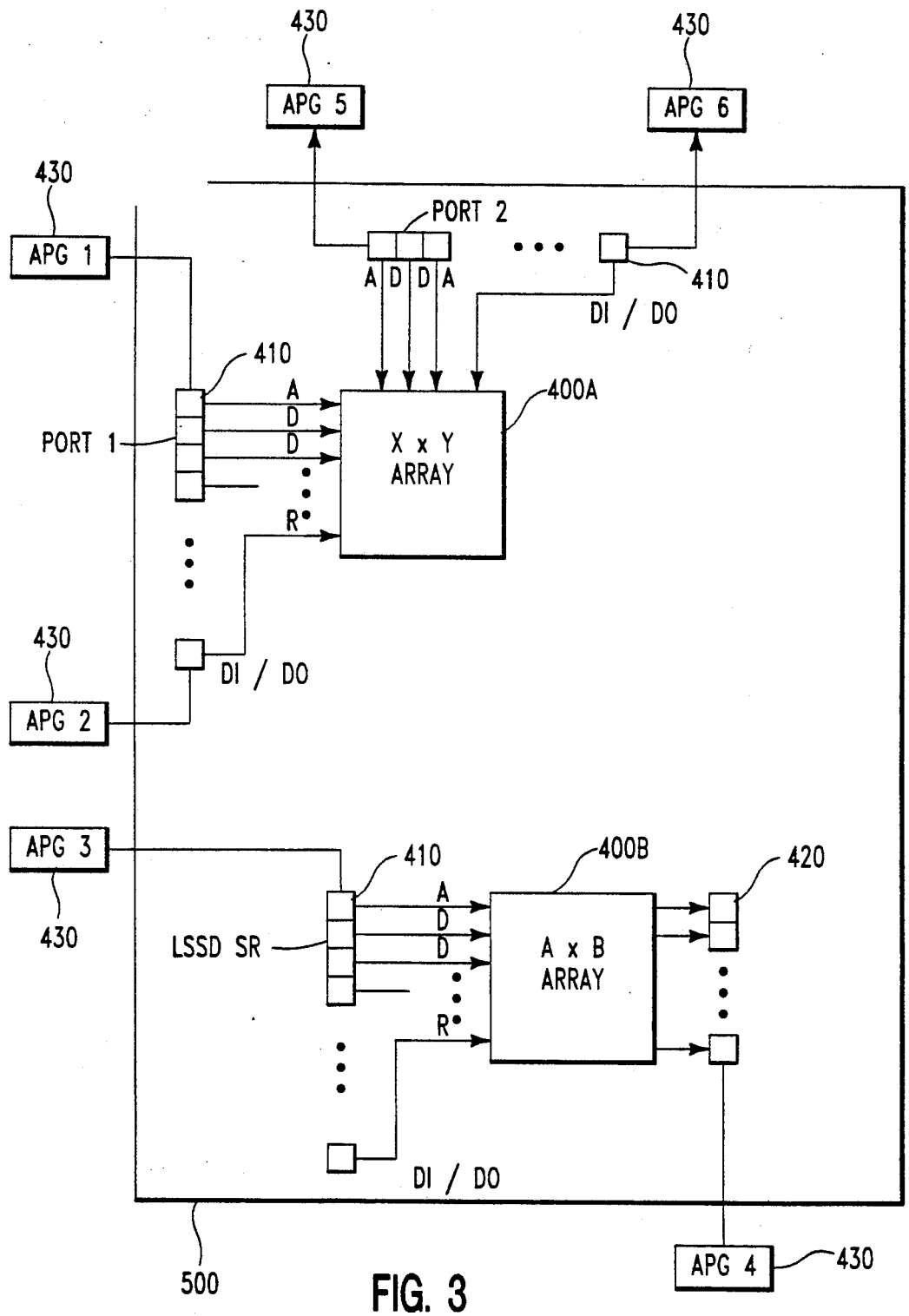
FIG. 3 is a schematic diagram of a test circuitry arrangement for simultaneously testing a plurality of embedded arrays, a subset of which may use multiple ports.

Referring now to FIG. 3, shown are a plurality of embedded arrays 400 in a DUT 500. An LSSD shift register chain 410 is attached to each array 400, either driving the array 400 or as an output shift register chain 420. Each LSSD shift register chain is, respectively, serviced by an LSSD APG (blocks 430), within the tester pin electronic. It is evident from the above discussions, that each array can be simultaneously tested by the appropriate LSSD APG and LSSD chain servicing both its inputs and outputs, as in 400a or by independent LSSD input and output shift register chains, as in 400b. In the case of a single LSSD chain servicing both the input and outputs of the embedded array 400a, the array may require the use of common input/outputs to provide binary data to the array and reading outputs from the array with the same circuitry.

While this invention has been particularly shown and described with reference to preferred embodiments thereof, it will be understood by those skilled in the art that the foregoing and other changes in the form and detail may be made without departing from the spirit and the scope of the invention.

What is claimed is:

1. A test pattern generator for testing embedded arrays in a device-under-test (DUT) designed in accord with level-sensitive-scan-design (LSSD) rules comprising:
   a command storage circuit for generating binary test patterns and control signals related thereto;
   at least two independent counters for operating in one of a plurality of functional states in response to said binary test patterns and producing data signals indicative thereof;
   an output data circuit for producing output data in response to said data signals from said at least two counters and said control signals; and
   selection circuitry for selecting said output data in a predetermined sequence corresponding to the LSSD of the embedded arrays contained in the DUT.

2. A test pattern generator as set forth in claim 1 further including means for comparing the data signals from said at least two counters.

3. A test pattern generator as set forth in claim 1 wherein in one of said functional states one of said counters is incremented starting at any count.

4. A test pattern generator as set forth in claim 1 wherein in a second of said functional states one of said counters is decremented starting at any count.

5. A test pattern generator as set forth in claim 1 further including means for transferring the data signals from one of said at least two counters to the other of said at least two counters.

6. A test pattern generator as set forth in claim 1 wherein a carry bit of one of said two counters is stopped while incrementing the count in said one of said two counters and a borrow bit is stopped while decrementing the count in said one of said two counters.

7. A test pattern generator as set forth in claim 6 wherein incrementing and decrementing of the count in the other of said at least two counters is controlled by a carry bit in said one of said at least two counters.

* * * * *